(12) United States Patent
Hirata et al.

(10) Patent No.: US 9,808,884 B2
(45) Date of Patent: Nov. 7, 2017

(54) POLYCRYSTALLINE SIC WAFER PRODUCING METHOD

(71) Applicant: DISCO CORPORATION, Tokyo (JP)

(72) Inventors: Kazuya Hirata, Tokyo (JP); Yoko Nishino, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/204,576

(22) Filed: Jul. 7, 2016

(65) Prior Publication Data
US 2017/0014944 A1    Jan. 19, 2017

(30) Foreign Application Priority Data
Jul. 13, 2015   (JP) .................. 2015-139679

(51) Int. Cl.
| | |
|---|---|
| H01L 21/02 | (2006.01) |
| B23K 26/00 | (2014.01) |
| B23K 26/0622 | (2014.01) |
| B28D 5/00 | (2006.01) |
| B23K 26/53 | (2014.01) |
| B23K 103/00 | (2006.01) |

(52) U.S. Cl.
CPC ...... *B23K 26/0057* (2013.01); *B23K 26/0006* (2013.01); *B23K 26/0622* (2015.10); *B23K 26/53* (2015.10); *B28D 5/0011* (2013.01); *B23K 2203/56* (2015.10)

(58) Field of Classification Search
CPC ............... H01L 21/02; H01L 21/02008; H01L 21/0201; B23K 26/0057; B23K 26/0622; B23K 26/53; B23K 26/0006; B23K 2203/56
See application file for complete search history.

(56) References Cited

U.S. PATENT DOCUMENTS

| | | | | |
|---|---|---|---|---|
| 9,620,415 | B2 * | 4/2017 | Hirata | H01L 21/78 |
| 2003/0141505 | A1 * | 7/2003 | Isobe | H01L 27/12 257/66 |
| 2012/0055546 | A1 * | 3/2012 | Turner | B23K 26/073 136/256 |
| 2012/0111495 | A1 * | 5/2012 | Shimoi | B23K 26/0057 156/250 |
| 2016/0052090 | A1 * | 2/2016 | Tanigawa | B23K 26/0624 219/121.69 |
| 2016/0093763 | A1 * | 3/2016 | Rana | B23K 26/0084 438/57 |
| 2017/0053829 | A1 * | 2/2017 | Hirata | H01L 21/78 |

FOREIGN PATENT DOCUMENTS

| | | |
|---|---|---|
| JP | 2000-094221 | 4/2000 |
| JP | 2014-216555 | 11/2014 |

* cited by examiner

*Primary Examiner* — Seahvosh Nikmanesh
(74) *Attorney, Agent, or Firm* — Greer Burns & Crain, Ltd.

(57) ABSTRACT

There is provided a polycrystalline SiC wafer producing method. In this method, in a modified layer forming step for forming an interface for producing a polycrystalline SiC wafer from a polycrystalline SiC ingot, the formed interface is a surface formed by linking of modified layers formed in such a manner that an initial modified layer is formed through splitting of polycrystalline SiC into amorphous silicon and amorphous carbon at the light focus point of a pulse laser beam and then polycrystalline SiC splits into amorphous silicon and amorphous carbon at a position at which the power density is constant with absorption of the continuously-emitted pulse laser beam by amorphous carbon formed in advance.

4 Claims, 5 Drawing Sheets

POLYCRYSTALLINE SIC WAFER PRODUCING METHOD

BACKGROUND OF THE INVENTION

Field of the Invention

The present invention relates to a method for producing a polycrystalline SiC wafer by irradiating a polycrystalline SiC ingot with a laser beam.

Description of the Related Art

Power devices, LEDs, and so forth are formed on a surface of a wafer including hexagonal single crystal SiC as a material in such a manner as to be marked out by planned dividing lines, and are used for various pieces of electrical and electronic equipment such as mobile phones and personal computers through dividing into individual device chips by a cutting apparatus and a laser processing apparatus. The hexagonal single crystal SiC wafer from which devices are formed is generated by slicing a single crystal SiC ingot by a wire saw generally and the front and back surfaces of the sliced wafer are polished to be finished into mirror surfaces (for example, refer to Japanese Patent Laid-open No. 2000-094221).

Meanwhile, for manufacturing of the hexagonal single crystal SiC wafer, which is expensive, the following method has been proposed as a method for reducing the manufacturing cost. First, a polycrystalline SiC ingot, which is more inexpensive than the hexagonal single crystal SiC, is formed and a flat polycrystalline SiC wafer is cut out with a thickness of about 300 μm for example from this polycrystalline SiC ingot. Then, to the upper surface of the cut-out polycrystalline SiC wafer, a hexagonal single crystal SiC wafer in which a separation layer is formed through implantation of hydrogen ions to a predetermined thickness (for example, thickness of 1 μm) and so forth is bonded. Then, the hexagonal single crystal SiC wafer is separated, with a hexagonal single crystal SiC layer having a thickness of 1 μm left on the upper surface of the polycrystalline SiC wafer. Thereby, a wafer that includes the polycrystalline SiC wafer as the base material and has a front surface composed of the hexagonal single crystal SiC wafer is formed (for example, refer to Japanese Patent Laid-open No. 2014-216555).

SUMMARY OF THE INVENTION

However, although the polycrystalline SiC is inexpensive compared with the single crystal SiC, the following problem is involved in a conventionally-known method in which an ingot of polycrystalline SiC is grown on a carbon substrate and then the carbon substrate is removed and a polycrystalline SiC wafer having a desired thickness is generated. Specifically, when the carbon substrate is removed from the polycrystalline SiC ingot, this polycrystalline SiC ingot is greatly deformed and this deformed part is discarded at a high percentage when the polycrystalline SiC wafer is cut out, which is uneconomical although the inexpensive polycrystalline SiC is used.

Therefore, an object of the present invention is to provide a polycrystalline SiC wafer producing method for efficiently producing a polycrystalline SiC wafer from a polycrystalline SiC ingot to reduce the percentage of the discarded part.

In accordance with an aspect of the present invention, there is provided a polycrystalline SiC wafer producing method for producing a polycrystalline SiC wafer from a polycrystalline SiC ingot. The method includes a modified layer forming step of positioning a light focus point of a pulse laser beam having such a wavelength as to be transmitted through the polycrystalline SiC ingot at a predetermined position from an irradiated surface of the polycrystalline SiC ingot and irradiating the polycrystalline SiC ingot with the pulse laser beam to form modified layers at a position at which an interface between the polycrystalline SiC wafer and the polycrystalline SiC ingot is to be formed, and a polycrystalline SiC wafer separating step of giving an external force to the upper side relative to the interface formed by the modified layer forming step and separating the polycrystalline SiC wafer from the interface. The interface formed in the modified layer forming step is a surface formed by linking of modified layers formed in such a manner that an initial modified layer is formed through splitting of polycrystalline SiC into amorphous silicon and amorphous carbon at the light focus point of the pulse laser beam, the pulse laser beam emitted next is absorbed by the amorphous carbon formed by the pulse laser beam emitted in advance and polycrystalline SiC splits into amorphous silicon and amorphous carbon on the irradiated surface side relative to the light focus point, and polycrystalline SiC splits into amorphous silicon and amorphous carbon at a position at which the power density is constant with absorption of the continuously-emitted pulse laser beam by amorphous carbon formed continuously in advance.

Preferably, an overlapping rate obtained on the basis of (D−x)/D is set to 0.6 to 0.8 if the diameter of spots of the laser beam at the position at which the interface is to be formed is defined as D and the distance between adjacent spots is defined as x.

Furthermore, it is preferable that the power density per one pulse at the interface be 70 to 100 J/cm², and it is preferable that the polycrystalline SiC ingot have a carbon substrate.

In the polycrystalline SiC wafer producing method according to the present invention, the interface formed in the modified layer forming step is a surface formed by linking of modified layers formed in such a manner that the initial modified layer is formed through splitting of polycrystalline SiC into amorphous silicon and amorphous carbon at the light focus point of the pulse laser beam, the pulse laser beam emitted next is absorbed by the amorphous carbon formed by the pulse laser beam emitted in advance and polycrystalline SiC splits into amorphous silicon and amorphous carbon on the irradiated surface side relative to the light focus point, and polycrystalline SiC splits into amorphous silicon and amorphous carbon at the position at which the power density is constant with absorption of the continuously-emitted pulse laser beam by amorphous carbon formed continuously in advance. Due to this, the polycrystalline SiC ingot is not deformed when a polycrystalline SiC wafer is cut out from the polycrystalline SiC ingot. Furthermore, there is no dependence on the c-plane, which is the interface in e.g. extraction of a single crystal SiC wafer from an ingot. Thus, the polycrystalline SiC wafer can be efficiently generated from the polycrystalline SiC ingot.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
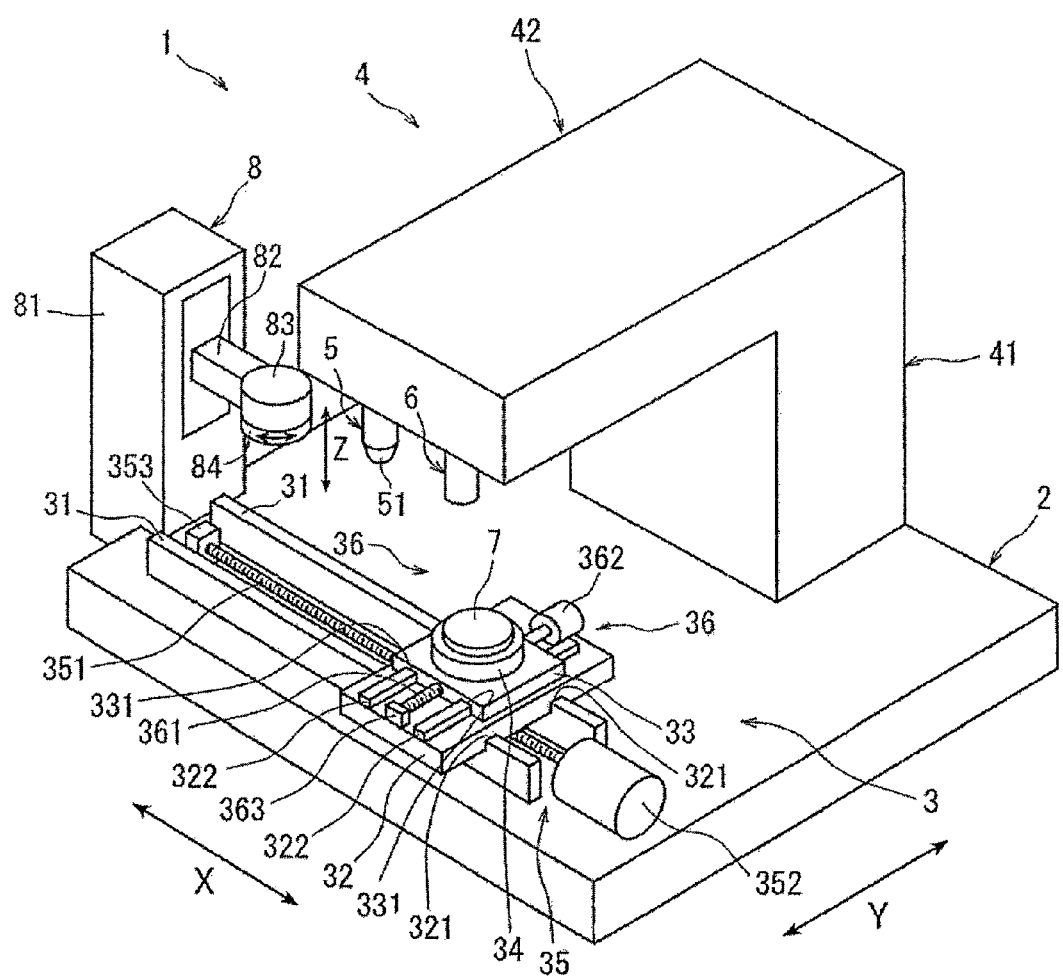
FIG. 1 is a perspective view of a laser processing apparatus for carrying out a polycrystalline SiC wafer producing method according to the present invention.

A preferred embodiment of a polycrystalline SiC wafer producing method according to the present invention will be further described below with reference to the accompanying drawings. FIG. 1 shows a perspective view of a laser processing apparatus for carrying out the polycrystalline SiC wafer producing method according to the present invention. A laser processing apparatus 1 shown in FIG. 1 includes a stationary base 2, a holding table mechanism 3 that is disposed on this stationary base 2 movably in an X-axis direction shown by an arrow X and is for holding a workpiece, and a laser beam irradiation unit 4 as laser beam irradiating means disposed on the stationary base 2.

The above-described holding table mechanism 3 includes the following components: a pair of guide rails 31 disposed in parallel along the X-axis direction on the stationary base 2; a first slide block 32 disposed on these guide rails 31 movably in the X-axis direction; a second slide block 33 disposed over this first slide block 32 movably in a Y-axis direction that is orthogonal to the X-axis direction and is shown by an arrow Y; and a holding table 34 that has a circular cylindrical shape and is rotatably configured on the second slide block 33 by internally including a pulse motor. In the laser processing apparatus 1 shown in FIG. 1, a polycrystalline SiC ingot 7 as a workpiece is placed on the holding table 34. This polycrystalline SiC ingot 7 is what is grown on a carbon substrate 9 and this carbon substrate 9 is strongly joined to the upper surface of the holding table 34 with the intermediary of a bond agent applied on this upper surface.

In the lower surface of the first slide block 32, a pair of guided grooves 321 fitted to the pair of guide rails 31 are made. In addition, a pair of guide rails 322 formed in parallel along the Y-axis direction are provided on the upper surface of the first slide block 32. The first slide block 32 formed in this manner is configured to be allowed to move in the X-axis direction along the pair of guide rails 31 by the fitting of the guided grooves 321 to the guide rails 31. The holding table mechanism 3 includes X-axis direction moving means 35 for moving the first slide block 32 in the X-axis direction along the pair of guide rails 31. The X-axis direction moving means 35 includes a male screw rod 351 disposed between the pair of guide rails 31 in parallel and a drive source such as a pulse motor 352 for rotationally driving this male screw rod 351. One end of the male screw rod 351 is rotatably supported by a bearing block 353 fixed to the stationary base 2 and the other end thereof is joined to the output shaft of the pulse motor 352 for power transmission. The male screw rod 351 is screwed to a penetrating female screw hole formed in a female screw block (not shown) provided on the lower surface of the central part of the first slide block 32 in a protruding manner. Therefore, by driving the male screw rod 351 for the forward rotation and reverse rotation thereof by the pulse motor 352, the first slide block 32 is moved in the X-axis direction along the guide rails 31.

In the lower surface of the second slide block 33, a pair of guided grooves 331 fitted to the pair of guide rails 322 provided on the upper surface of the first slide block 32 are provided. The second slide block 33 is configured to be allowed to move in the Y-axis direction by the fitting of these guided grooves 331 to the pair of guide rails 322. The holding table mechanism 3 shown in FIG. 1 includes Y-axis direction moving means 36 for moving the second slide block 33 along the pair of guide rails 322 provided on the first slide block 32. The Y-axis direction moving means 36 includes a male screw rod 361 disposed between the pair of guide rails 322 in parallel and a drive source such as a pulse motor 362 for rotationally driving this male screw rod 361. One end of the male screw rod 361 is rotatably supported by a bearing block 363 fixed to the upper surface of the first slide block 32 and the other end is joined to the output shaft of the pulse motor 362 for power transmission. The male screw rod 361 is screwed to a penetrating female screw hole formed in a female screw block (not shown) provided on the lower surface of the center of the second slide block 33 in a protruding manner. Therefore, by causing the forward rotation and reverse rotation of the male screw rod 361, the second slide block 33 is moved in the Y-axis direction along the guide rails 322.

The above-described first slide block and second slide block are provided with X-axis direction position detecting means that detects the X-axis direction position and Y-axis direction position detecting means that detects the Y-axis direction position, respectively, neither of which is shown in the diagram. This makes it possible to, by control means to be described later, transmit a drive signal to the above-described respective drive sources on the basis of the detected positions of the first and second slide blocks and control the holding table 34 to a desired position.

The laser beam irradiation unit 4 includes a support member 41 disposed on the stationary base 2, a casing 42 that is supported by this support member 41 and horizontally extends substantially, laser beam irradiating means 5 disposed on this casing 42, and imaging means 6 that is disposed at the front end part of the casing 42 and detects a processing region in which laser processing should be carried out. The imaging means 6 includes illuminating means that illuminates a workpiece, an optical system that captures the region illuminated by this illuminating means, an imaging element (CCD) that takes an image captured by this optical system, and so forth. The imaging means 6 sends an image signal obtained by the imaging to the control means to be described later.

The laser beam irradiating means 5 includes a light collector 51 that collects a laser beam oscillated from pulse laser beam oscillating means housed inside the casing 42 and emits the laser beam onto the workpiece held by the holding table 34. Although diagrammatic representation is omitted, the pulse laser beam oscillating means in the casing 42 is composed of output adjusting means of the pulse laser beam, a pulse laser beam oscillator, repetition frequency setting means annexed thereto, and so forth. The pulse laser beam oscillating means is so controlled that the position of the light focus point of the pulse laser beam can be adjusted in the direction (Z-axis direction) perpendicular to the holding surface as the upper surface of the holding table 34.

Moreover, the laser processing apparatus 1 includes polycrystalline SiC wafer separating means 8 that is disposed on the stationary base 2 and is set near the termination part of the guide rails 31 (on the side of the bearing block 353 that supports the male screw rod 351). This polycrystalline SiC wafer separating means 8 includes the following components: a separating unit case 81; a separating unit arm 82 that is partly housed in this separating unit case 81 and is supported movably in the Z-axis direction (upward-downward direction) shown by an arrow Z; a separation pulse motor 83 disposed at the tip part of this separating unit arm 82; and wafer adsorbing means 84 that is rotatably supported by this separation pulse motor 83 under the separation pulse motor 83 and has plural suction holes through which suction can be carried out by suction means (not shown) in the lower surface thereof. In the separating unit case 81, Z-axis direction moving means that controls the movement of the separating unit arm 82 in the Z-axis direction is provided. As the Z-axis direction moving means, a male screw rod (not shown) that supports the separating unit arm 82, a bearing block that supports this male screw rod, and a pulse motor for driving this male screw rod for the forward rotation and reverse rotation thereof are housed. The separating unit case 81 is provided with Z-axis direction position detecting means (not shown) that detects the position of the separating unit arm 82 in the Z-axis direction and a position signal thereof is sent to the control means to be described later.

The laser processing apparatus 1 includes the control means (not shown). This control means is formed of a computer and includes a central processing device that executes arithmetic processing in accordance with a control program, a read only memory (ROM) that stores the control program, a random access memory (RAM) that stores arithmetic results and so forth and is readable and writable, and input and output interfaces. To the input interface of this control means, detection signals from the above-described X-axis direction position detecting means, Y-axis direction position detecting means, Z-axis direction position detecting means, imaging means 6, and so forth are input. From the output interface, control signals are output to the above-described X-axis direction moving means 35, Y-axis direction moving means 36, Z-axis direction moving means in the separating unit case 81, light focus point position control means of the pulse laser beam, output control means of the pulse laser beam, separation pulse motor 83, and so forth.

The polycrystalline SiC wafer producing method according to the present invention carried out by using the laser processing apparatus 1 configured in the above-described manner will be described.

Figure 2:
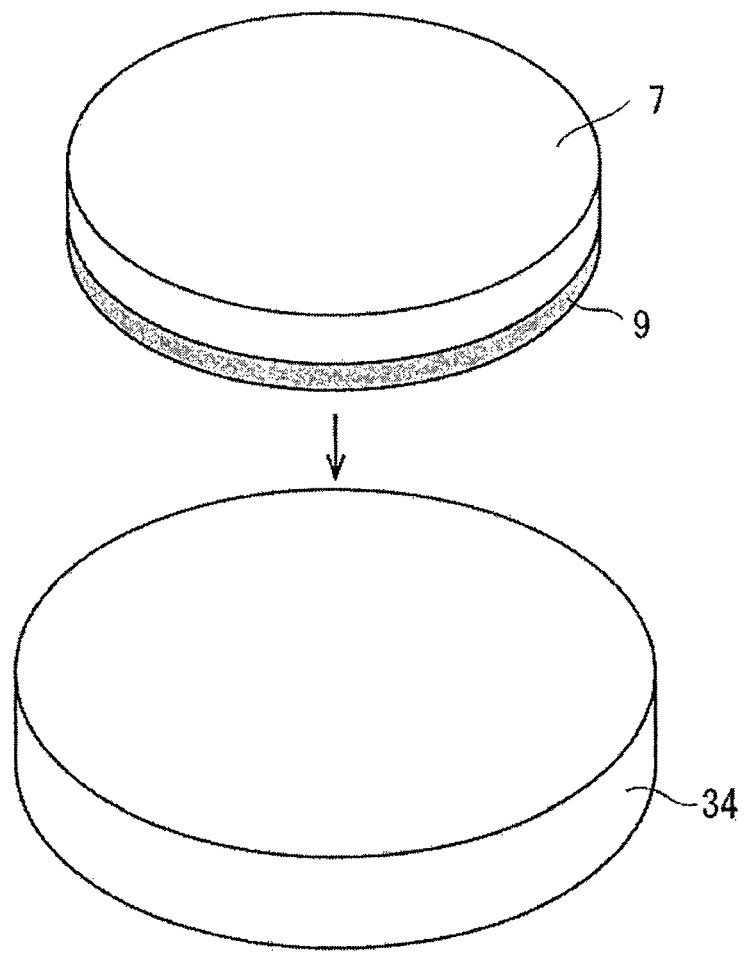
FIG. 2 is a diagram showing the state in which a polycrystalline SiC ingot is mounted on a holding table shown in FIG. 1.

FIG. 2 shows the polycrystalline SiC ingot 7 as a workpiece to be processed by the polycrystalline SiC wafer producing method in the embodiment of the present invention and the holding table 34 that holds this polycrystalline SiC ingot 7. As this polycrystalline SiC ingot 7, an ingot generated by growing polycrystalline SiC on the carbon substrate 9 is used and an ingot generated with a thickness of 10 mm is used for example.

As shown in FIG. 2, the polycrystalline SiC ingot 7 is fixed on the holding table 34, with the carbon substrate 9 set on the lower side. This fixing is carried out by an adhesive (for example, epoxy resin) made to intervene between the holding table 34 and the carbon substrate 9, and the polycrystalline SiC ingot 7 is fixed more strongly than by a chuck table with use of the suction means that is used in a general laser processing apparatus and is for fixing a workpiece (workpiece supporting step). The surface of the polycrystalline SiC ingot 7 is polished by a polishing apparatus (not shown) to such an extent that the incidence of a laser beam that will be described later and employs such a wavelength as to be transmitted through the polycrystalline SiC ingot 7 is not hindered.

(Modified Layer Forming Step)

After the above-described workpiece supporting step is carried out, the holding table 34 that holds the polycrystalline SiC ingot 7 is positioned directly beneath the imaging means 6 by the X-axis direction moving means 35 and the Y-axis direction moving means 36. When the holding table 34 is positioned directly beneath the imaging means 6, an alignment step of detecting the region in which laser processing of the polycrystalline SiC ingot 7 is to be carried out and the surface height of the polycrystalline SiC ingot 7 placed on the holding table 34 is carried out by the imaging means 6 and the above-described control means.

Figure 3A:
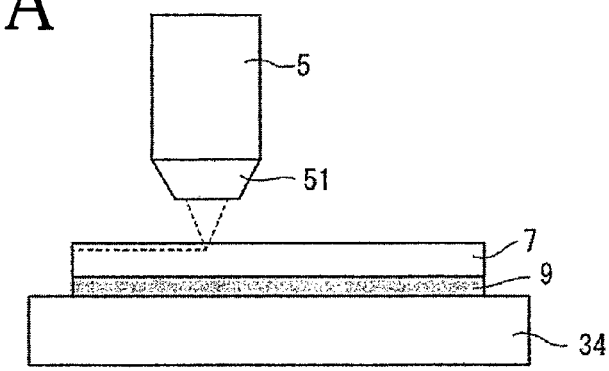
FIGS. 3A to 3C are diagrams showing the state in which the polycrystalline SiC ingot is irradiated with a pulse laser beam.
Figure 3B:
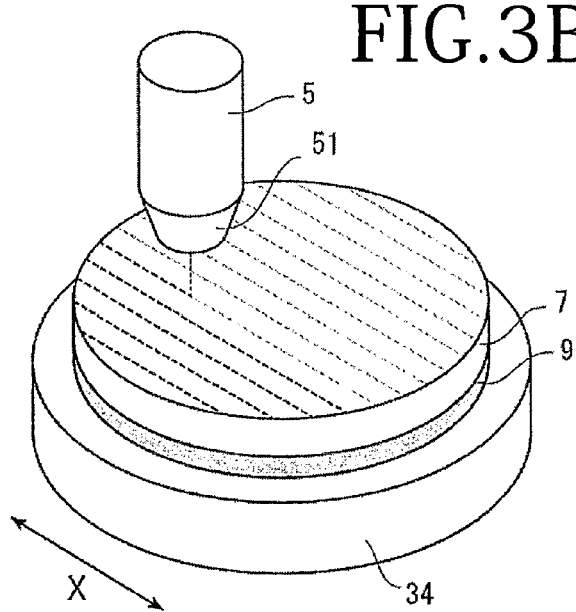

After the alignment step is carried out, the above-described X-axis direction moving means 35 and Y-axis direction moving means 36 are actuated to position the polycrystalline SiC ingot 7 at a spot at which the laser processing is to be started. In addition, on the basis of the surface height position of the polycrystalline SiC ingot 7 detected by the alignment step, a light focus point P of the pulse laser beam is set to the inside of the polycrystalline SiC ingot 7 at a predetermined distance (for example, 510 μm) from the surface of the polycrystalline SiC ingot 7 fixed on the holding table 34 by light focus point position adjusting means (not shown). Then, the pulse laser beam irradiating means 5 is actuated and irradiation with the pulse laser beam having capability of being transmitted through polycrystalline SiC is started. As shown in FIGS. 3A and 3B, along with the start of the irradiation with the pulse laser beam, the X-axis direction moving means 35 is actuated to move the holding table 34 in the arrow direction of the X-axis.

The condition of the processing by the above-described pulse laser beam is set as follows for example.
Light source: YAG pulse laser
Wavelength: 1064 nm
Repetition frequency: 80 kHz
Average output: 3.2 W (2.6 to 3.8 W)
Pulse width: 4 ns
Spot diameter: light focus point φ 3.0 μm (interface φ 7.8 μm)
Aperture ratio (NA): 0.43
Index amount: 250 to 400 μm
Feed speed: 120 to 260 mm/second Moreover, details of the modified layer forming step of the invention of the present application will be described. When irradiation with the pulse laser beam is started along a processing line by the pulse laser beam set in the control means in advance, the energy at the light focus point P of the first pulse laser beam and the vicinity thereof becomes energy surpassing the bandgap of the polycrystalline SiC and an initial modified layer obtained due to splitting of the polycrystalline SiC into amorphous silicon and amorphous carbon is formed. In this state, the holding table 34 is moved at a predetermined processing feed speed by the X-axis direction moving means 35. In addition, the next pulse laser beam is emitted at the above-described repetition frequency set in advance.

Figure 4A:
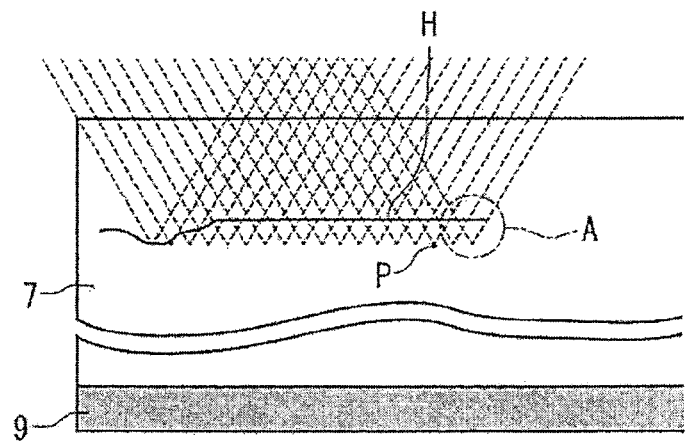
FIGS. 4A to 4D are diagrams for explaining the state in which spots overlap at a height position H at which an interface is to be formed in the state in which the polycrystalline SiC ingot is irradiated with the pulse laser beam.
Figure 4B:
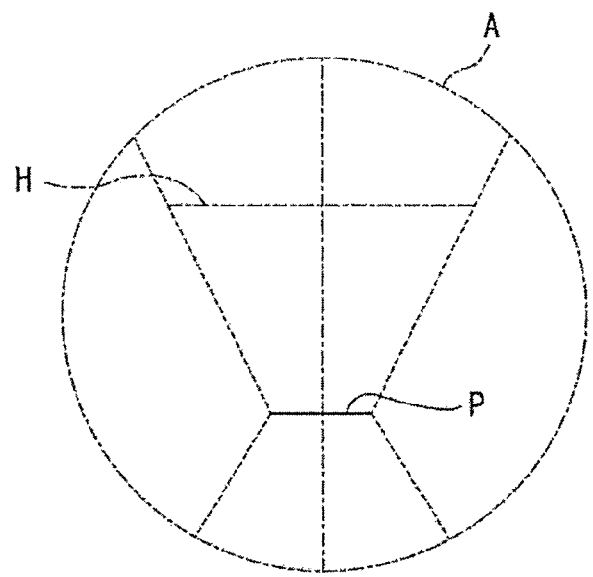
Figure 4C:
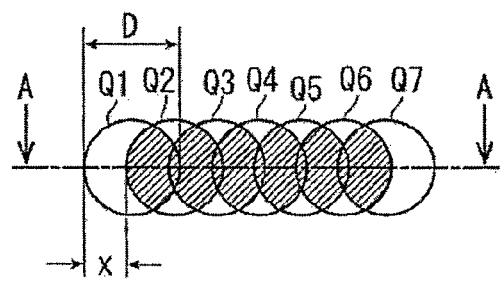
Figure 4D:

Here, this next emitted pulse laser beam is so emitted as to overlap with the initial modified layer formed initially in the X-axis direction. Thus, this next emitted pulse laser beam is absorbed by the amorphous carbon formed in this initial modified layer. As a result, on the irradiated surface side relative to the light focus point P, a modified layer is formed at a height position H (for example, position separate upward from the light focus point P by 10 μm, i.e. position at a distance of 500 μm from the upper surface) at which the power density is constant (for example, 85 J/cm$^2$) (see FIG. 4A and FIG. 4B). Furthermore, as shown in FIG. 4C obtained when the spot shape of the pulse laser beam at the height position H in FIG. 4A is viewed from the upper side, spots adjacent at the height position H at which the power density is constant on the incident surface side relative to the light focus point P of the pulse laser beam are continuously irradiated at a distance x smaller than the diameter D of these spots. Thus, continuous spots Q1 and so forth of the pulse laser beam are so irradiated as to overlap in the range of D-x and a surface in which the polycrystalline SiC is split into amorphous silicon and amorphous carbon with absorption by amorphous carbon of the modified layer formed in advance is formed. As shown in FIG. 4D as a section along line A-A in FIG. 4C, at the height position H at which the power density is constant, the modified layers formed by the splitting into the amorphous silicon and the amorphous carbon are formed in a linking manner.

Figure 3C:
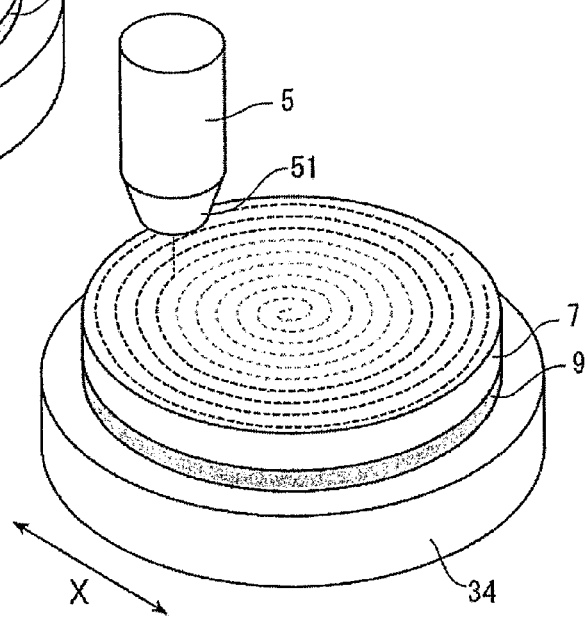

Furthermore, when the above-described irradiation with the pulse laser beam is carried out for all planned processing lines shown in FIG. 3B, modified layers serving as an interface for separating the upper surface side relative to the above-described height position H as a polycrystalline SiC wafer are formed inside the polycrystalline SiC ingot and over the whole region at the height position H. In forming this interface, the way of forming the modified layers is not limited to the case of providing the modified layers in a straight line manner as in FIG. 3B and it is also possible to continuously form the modified layers in a spiral manner as described in FIG. 3C. In this case, the formation of the modified layers can be realized by setting the start point of the irradiation with the pulse laser beam at a position that passes through the center of the polycrystalline SiC ingot as viewed from the Y-axis direction and is on the outermost circumferential side and moving the holding table 34 in the X-axis direction while rotating the holding table 34.

(Polycrystalline SiC Wafer Separating Step)

Figure 5:
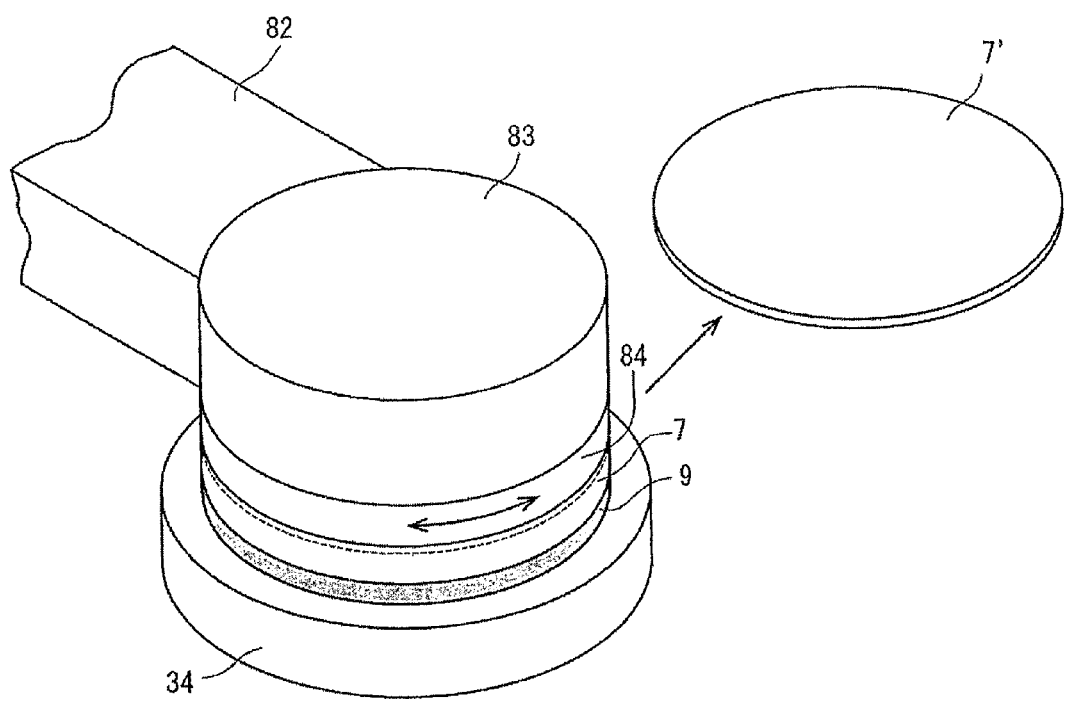
FIG. 5 is a perspective view showing the state in which a polycrystalline SiC wafer is separated from the polycrystalline SiC ingot by a polycrystalline SiC wafer separating step.

After the end of the above-described modified layer forming step, the holding table 34 on which the polycrystalline SiC ingot is placed is moved to the termination part side, on which the polycrystalline SiC wafer separating means 8 is disposed, and is positioned directly beneath the wafer adsorbing means 84 by controlling the X-axis direction moving means 35 and the Y-axis direction moving means 36. On the basis of the height position of the upper surface of the polycrystalline SiC ingot 7 detected and input to the control means in advance, the separating unit arm 82 is moved down to be brought into tight contact with the upper surface of this polycrystalline SiC ingot 7. In addition, the suction means (not shown) is actuated to cause the wafer adsorbing means 84 to adsorb the polycrystalline SiC ingot 7 and fix the polycrystalline SiC ingot 7 (see FIG. 5). Then, in the state in which this wafer adsorbing means 84 and the polycrystalline SiC ingot 7 are fixed, the separation pulse motor 83 is actuated to rotationally drive the wafer adsorbing means 84 and give a torsional force to the polycrystalline SiC ingot 7. Thereby, the upper part side of the polycrystalline SiC ingot 7 is separated, with the interface being the boundary, so that one polycrystalline SiC wafer 7' can be obtained.

In the case of further obtaining a polycrystalline SiC wafer from the above-described polycrystalline SiC ingot 7 after obtaining the polycrystalline SiC wafer 7' from the polycrystalline SiC ingot 7, the upper surface of the polycrystalline SiC ingot is polished by polishing means (not shown) provided on the stationary base 2 and the above-described steps are repeatedly carried out from the beginning as a new polycrystalline SiC ingot. Thereby, plural polycrystalline SiC wafers 7' can be obtained with almost no waste of the polycrystalline SiC. The lower surface (interface side) of the polycrystalline SiC wafer 7' may be polished according to need.

When the spot diameter at the height position H when the modified layers serving as the above-described interface are formed is defined as D and the distance between the adjacent spots is defined as x, it is preferable to set (D-x)/D, i.e. the overlapping rate of the adjacent spots, to 0.6 to 0.8. Setting the overlapping rate in this manner makes it possible to continuously form the layer in which the polycrystalline SiC is split into amorphous carbon and amorphous silicon, serving as the interface when a polycrystalline SiC wafer is separated, without discontinuity.

Furthermore, the power density of the pulse laser beam to form the spots at the height position H at which the above-described interface is to be formed is set to 85 J/cm$^2$ in the above-described embodiment. However, the power density may be set to a value of 70 to 100 J/cm$^2$. Proper power density for the formation of the interface at the desired height position H somewhat varies depending on the quality of the polycrystalline SiC ingot used and so forth. However, the power density is set to fall within this numerical range in order to continuously emit the pulse laser beam so that the spots may overlap and continuously form the interface for separation. This can obtain a favorable interface.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A polycrystalline SiC wafer producing method for producing a polycrystalline SiC wafer from a polycrystalline SiC ingot, the method comprising:

a modified layer forming step of positioning a light focus point of a pulse laser beam having such a wavelength as to be transmitted through the polycrystalline SiC ingot at a predetermined position from an irradiated surface of the polycrystalline SiC ingot and irradiating the polycrystalline SiC ingot with the pulse laser beam to form modified layers at a position at which an interface between the polycrystalline SiC wafer and the polycrystalline SiC ingot is to be formed; and a polycrystalline SiC wafer separating step of giving an external force to an upper side relative to the interface formed by the modified layer forming step and separating the polycrystalline SiC wafer from the interface, wherein the interface formed in the modified layer forming step is a surface formed by linking of modified layers formed in such a manner that an initial modified layer is formed through splitting of polycrystalline SiC into amorphous silicon and amorphous carbon at the light focus point of the pulse laser beam, the pulse laser beam emitted next is absorbed by the amorphous carbon formed by the pulse laser beam emitted in advance and polycrystalline SiC splits into amorphous silicon and amorphous carbon on an irradiated surface side relative to the light focus point, and polycrystalline SiC splits into amorphous silicon and amorphous carbon at a position at which power density is constant with absorption of the continuously-emitted pulse laser beam by amorphous carbon formed continuously in advance.

2. The polycrystalline SiC wafer producing method according to claim 1, wherein an overlapping rate obtained on the basis of (D−x)/D is set to 0.6 to 0.8 if diameter of spots of the laser beam at the position at which the interface is to be formed is defined as D and distance between adjacent spots is defined as x.

3. The polycrystalline SiC wafer producing method according to claim 1, wherein power density per one pulse at the interface is 70 to 100 J/cm$^2$.

4. The polycrystalline SiC wafer producing method according to claim 1, wherein the polycrystalline SiC ingot has a carbon substrate.

* * * * *